(12) United States Patent  
Romanenko et al.

(10) Patent No.: US 11,464,102 B2  
(45) Date of Patent: Oct. 4, 2022

(54) METHODS AND SYSTEMS FOR TREATMENT OF SUPERCONDUCTING MATERIALS TO IMPROVE LOW FIELD PERFORMANCE

(71) Applicant: Fermi Research Alliance, LLC, Batavia, IL (US)

(72) Inventors: Alexander Romanenko, Batavia, IL (US); Sam Posen, Arlington Heights, IL (US); Anna Grassellino, Batavia, IL (US)

(73) Assignee: FERMI RESEARCH ALLIANCE, LLC, Batavia, IL (US)

( * ) Notice: Subject to any disclaimer, the term of this patent is extended or adjusted under 35 U.S.C. 154(b) by 0 days.

(21) Appl. No.: 16/594,011

(22) Filed: Oct. 5, 2019

(65) Prior Publication Data

US 2020/0113039 A1    Apr. 9, 2020

Related U.S. Application Data

(60) Provisional application No. 62/742,328, filed on Oct. 6, 2018.

(51) Int. Cl.
| | |
|---|---|
| *H05H 7/20* | (2006.01) |
| *H01L 39/24* | (2006.01) |
| *G06N 10/00* | (2022.01) |
| *H01P 7/06* | (2006.01) |

(52) U.S. Cl.  
CPC .............. *H05H 7/20* (2013.01); *G06N 10/00* (2019.01); *H01L 39/24* (2013.01); *H01P 7/06* (2013.01)

(58) Field of Classification Search  
CPC ................................ H05H 7/20; G06N 10/00  
See application file for complete search history.

(56) References Cited

U.S. PATENT DOCUMENTS

| | | | |
|---|---|---|---|
| 3,687,823 A | 8/1972 | Lugscheider et al. | |
| 3,784,452 A | 1/1974 | Martens et al. | |
| 3,902,975 A | 9/1975 | Martens | |
| 3,939,053 A | 2/1976 | Diepers et al. | |
| 4,014,765 A | 3/1977 | Roth et al. | |
| 4,072,588 A | 2/1978 | Diepers | |
| 4,127,452 A | 11/1978 | Martens et al. | |
| 4,857,360 A * | 8/1989 | Halbritter ................. | C23C 8/24 427/62 |
| 5,232,903 A * | 8/1993 | Yamazaki ........... | H01L 39/2464 257/32 |
| 6,097,153 A | 8/2000 | Brawley et al. | |
| 6,645,353 B2 * | 11/2003 | Huff ..................... | H01J 37/3266 204/192.32 |
| 7,151,347 B1 | 12/2006 | Myneni et al. | |
| 9,343,649 B1 * | 5/2016 | Cooper ................. | B24B 31/006 |
| (Continued) | | | |

*Primary Examiner* — Paul A Wartalowicz  
(74) *Attorney, Agent, or Firm* — Loza & Loza LLP; Kevin L. Soules (57) ABSTRACT

A system and method for treating a cavity comprises preparing a superconducting radio frequency (SRF) cavity for removal of a dielectric layer from on an inner surface of the SRF cavity, subjecting the SRF cavity to a heat treatment in order to remove the dielectric layer from the inner surface of the SRF cavity, and preventing the development of a new dielectric layer on the inner surface of the SRF cavity by preventing an interaction between the inner surface of the SRF cavity and atmospheric gasses.

13 Claims, 9 Drawing Sheets

(56) References Cited

U.S. PATENT DOCUMENTS

| | | | |
|---|---|---|---|
| 2009/0215631 A1* | 8/2009 | Singer | H05H 7/18 |
| | | | 505/480 |
| 2010/0066273 A1* | 3/2010 | Saito | B21C 37/16 |
| | | | 315/500 |
| 2011/0183854 A1 | 7/2011 | Roy et al. | |
| 2018/0027644 A1 | 1/2018 | Cooley | |

* cited by examiner

FIG. 6

METHODS AND SYSTEMS FOR TREATMENT OF SUPERCONDUCTING MATERIALS TO IMPROVE LOW FIELD PERFORMANCE

CROSS REFERENCE TO RELATED PATENT APPLICATIONS

This patent application claims the priority and benefit under 35 U.S.C. § 119(e) of U.S. Provisional Patent Application Ser. No. 62/742,328 filed Oct. 6, 2018, entitled "METHODS AND SYSTEMS FOR TREATMENT OF SRF CAVITIES TO MINIMIZE TLS LOSSES." U.S. Provisional Patent Application Ser. No. 62/742,328 is herein incorporated by reference in its entirety.

STATEMENT OF GOVERNMENT RIGHTS

The invention described in this patent application was made with Government support under the Fermi Research Alliance, LLC, Contract Number DE-AC02-07CH11359 awarded by the U.S. Department of Energy. The Government has certain rights in the invention.

TECHNICAL FIELD

Embodiments are generally related to the field of metallurgy. Embodiments are further related to the field of superconductors. Embodiments are further related to superconducting radiofrequency cavities. Embodiments are generally related to the field of quantum computing. Embodiments are further related to methods and systems for reducing quality factor degradation consistent with two-level-system (TLS) defects hosted by niobium pentoxide, by minimizing or removing niobium pentoxide.

BACKGROUND

Superconducting radio frequency (SRF) cavities are state-of-the-art technology for modern accelerators. SRF cavities are widely used in modern particle accelerator applications, to transfer energy to beams of charged particles.

One potential application of such particle accelerators is quantum computing. There are numerous problems that must be solved to produce ideal quantum computers. One such problem is that quantum computers improve with extremely high quality factors "Q" (e.g. up to $Q>10^{11}$). The quality factor, or "Q" factor, is a dimensionless parameter that characterizes the resonance of an oscillator. A higher "Q" factor generally means the resonator resonates at a high amplitude at its resonant frequency. SRF cavities offer unique opportunities for various applications in the quantum-regime.

However, the quality factor of an SRF cavity decreases when going to the "quantum regime." The origin of the additional losses is a consequence of naturally occurring oxide layers that form on the surface of the cavity.

Accordingly, there is a need in the art for reducing quality factor degradation consistent with two-level-system (TLS) defects by minimizing or removing the oxide layer, as described in the embodiments disclosed herein.

SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method and system for improving superconducting materials.

It is another aspect of the disclosed embodiments to provide methods and systems for improving superconducting cavities.

It is another aspect of the disclosed embodiments to provide a method and system for improving SRF cavities and associated applications.

It is another aspect of the disclosed embodiments to provide improved equipment for realizing methods and systems for quantum computing.

It is another aspect of the disclosed embodiments to provide methods, systems, and apparatuses for reducing quality factor degradation consistent with TLS defects hosted by niobium pentoxide, by minimizing or removing the niobium pentoxide.

The aforementioned aspects and other objectives and advantages can now be achieved as described herein. Systems and methods for treating an SRF niobium cavity can comprise preparing a superconducting radio frequency (SRF) cavity for removal of a dielectric layer from on an inner surface of the SRF cavity, subjecting the SRF cavity to a heat treatment in order to remove the dielectric layer from the inner surface of the SRF cavity, and preventing the development of a new dielectric layer on the inner surface of the SRF cavity by preventing an interaction between the inner surface of the SRF cavity and atmospheric gasses.

While the description provided herein often refers to a "cavity" it should be appreciated that the methods and systems disclosed herein can also be applied to various non-cavity implementations. As such, it should be understood that the methods, systems, and procedures disclosed herein can be applied to, for example, other superconducting qubits (e.g. 2D architectures), without departing from the scope of this disclosure.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in the following non-limiting examples can be varied, and are cited merely to illustrate one or more embodiments and are not intended to limit the scope thereof. All values provided in the appendix are exemplary only, and may be varied in other embodiments.

Example embodiments will now be described more fully hereinafter with reference to the accompanying drawings, in which illustrative embodiments are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers refer to like elements throughout.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

The methods and systems disclosed herein are aimed at producing SRF cavities that can achieve very high quality factors (e.g. $Q>10^{10}$-$10^{11}$) corresponding to photon lifetimes as long as tens of seconds. It should be appreciated that this is much higher than the highest reported Q of approximately $10^8$ used in various quantum regime studies, where associated photon lifetimes are approximately 1 msec. The disclosed embodiments may thus be adopted for the creation of SRF cavities for 3D circuit QED architecture for quantum computing or memory applications—owing to the potential of a thousand-fold increase in the photon lifetime, and therefore improved cavity-stored quantum state coherence times. The two-level systems (TLS) residing inside niobium oxide play a significant role in the low field performance of such SRF cavities.

As used herein, a two-level system (TLS) relates to quantum systems that can exist in two independent quantum states. Two-level systems are basic quantum systems. A two-level system can be described with a wavefunction where the amplitude of the wavefunction oscillates between the two states. Quantum computing is based on two-level systems. A two-level system can be a quantum bit or "qubit." Qubits serve as the basic unit of quantum information—the equivalent of a bit in classical computing.

In certain embodiments, the disclosed methods and systems can be used to produce SRF cavities that can yield photon lifetimes of more than 2 seconds (and up to 10s of seconds), where Q decreases when going from temperatures of 1.4 K down to below 20 mK. Thus, the SRF cavities produced according to the methods and systems disclosed herein, can serve as the longest coherence platform for cQED and quantum memory applications.

It should be understood that in certain embodiments disclosed herein, a fine grain high residual resistivity ratio (RRR)>~200 bulk single cell niobium cavity, of the TESLA shape, with resonant frequencies of the TM010 modes of 1.3, 2.6, and 5.0 GHz can serve as the base cavity for further treatment. However, the single cell niobium cavity is meant to be exemplary and, in other embodiments, the disclosed methods and systems can be used to treat cavities of other shapes and with other properties, including cavities with multiple cells. Furthermore, the methods and systems disclosed herein can also be applied to various non-cavity implementations. As such, it should be understood that the methods, systems, and procedures disclosed herein can be applied to other superconducting qubits (e.g. 2D architectures), without departing from the scope of this disclosure. Likewise, other superconducting devices, can be treated in the manner disclosed herein, to remove dielectric layers.

In general, the disclosed embodiments involve subjecting a cavity to a heat treatment while maintaining the inner volume of the cavity at or near vacuum. The cavity can be subject to temperatures at or near, 340 degrees C. using a custom designed furnace. This treatment removes the natural dielectric layer (e.g. niobium pentoxide, or other such dielectric layer) formed on the surfaces of the cavity, and results in a marked improvement in TLS degradation.

In certain embodiments, the treated cavities can be inserted in a BlueFors dilution refrigerator at temperatures down to 10-20 mK. The treatment of the cavity yields cavity conditions where oxide is modified, reduced, and/or eliminated, thereby producing a cavity with an extremely high quality factor, $Q>\sim1\times10^{10}$. The treatment methods can suppress residual resistance at all fields.

Figure 1:
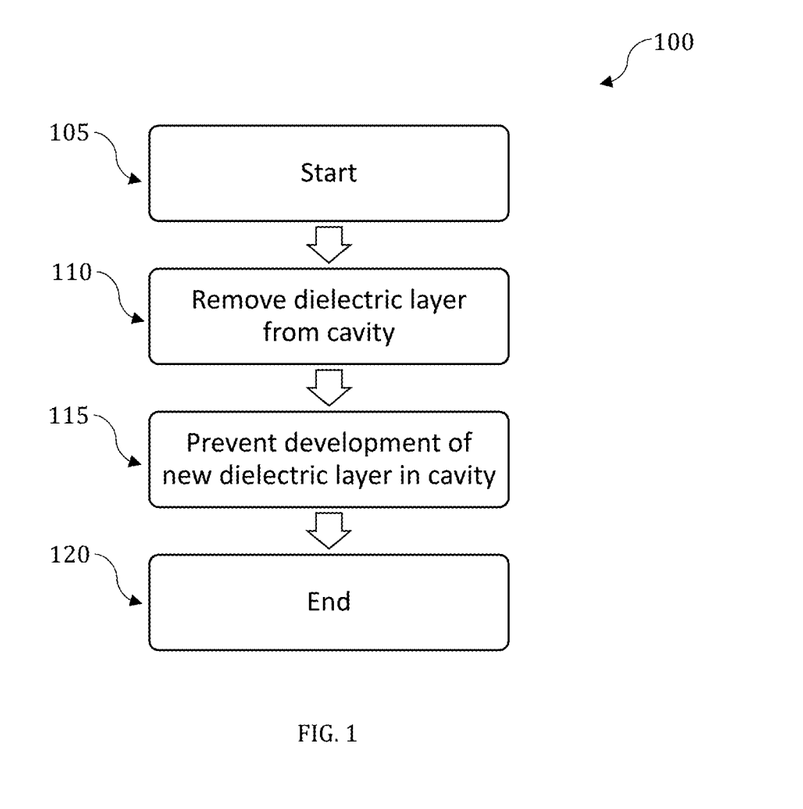
FIG. 1 depicts a method for treating an SRF cavity, associated with the disclosed embodiments.

FIG. 1, illustrates a general method 100 for treating a cavity in accordance with the disclosed embodiments, to reduce TLS degradation of the cavity performance, by removing any harmful dielectric layer(s) from the cavity. The method 100 starts at 105. At step 110, a dielectric layer in a cavity can be removed. Most commonly, step 110 comprises removing an oxide-based layer that naturally forms on the internal surface of the superconducting radio frequency cavity. However, in other embodiments as further discussed herein, the method can be applied to other cavities without departing from the scope of the embodiments disclosed herein.

The removal of the dielectric at step 110 can comprise various approaches. For example, step 110 can include dissolution of the dielectric layer via heat treatment, dispersion of the dielectric layer via heat treatment, removal of the dielectric layer via chemical reaction, reduction of the dielectric layer via chemical reaction, removal of the dielectric layer via bombardment with charged particles, and/or reduction of the dielectric layer via bombardment with charged particles.

Next at step 115, the method 100 can further include preventing the development of a new dielectric layer in the cavity. This step can generally include limiting the exposure of the internal surfaces of the cavity to gases that could react with the internal surface to create dielectric layers. This can include maintaining a vacuum in the cavity and/or adding a capping layer to the internal surfaces of the cavity.

It should be understood that one or both of steps 110 and 115 can be repeatedly performed to further reduce or remove any harmful dielectric that may form during or after one or more of the steps in method 100 are complete. In this way, the method can be employed to prevent the development of a harmful dielectric layer in the SRF cavity. The method ends at step 120.

Figure 2:
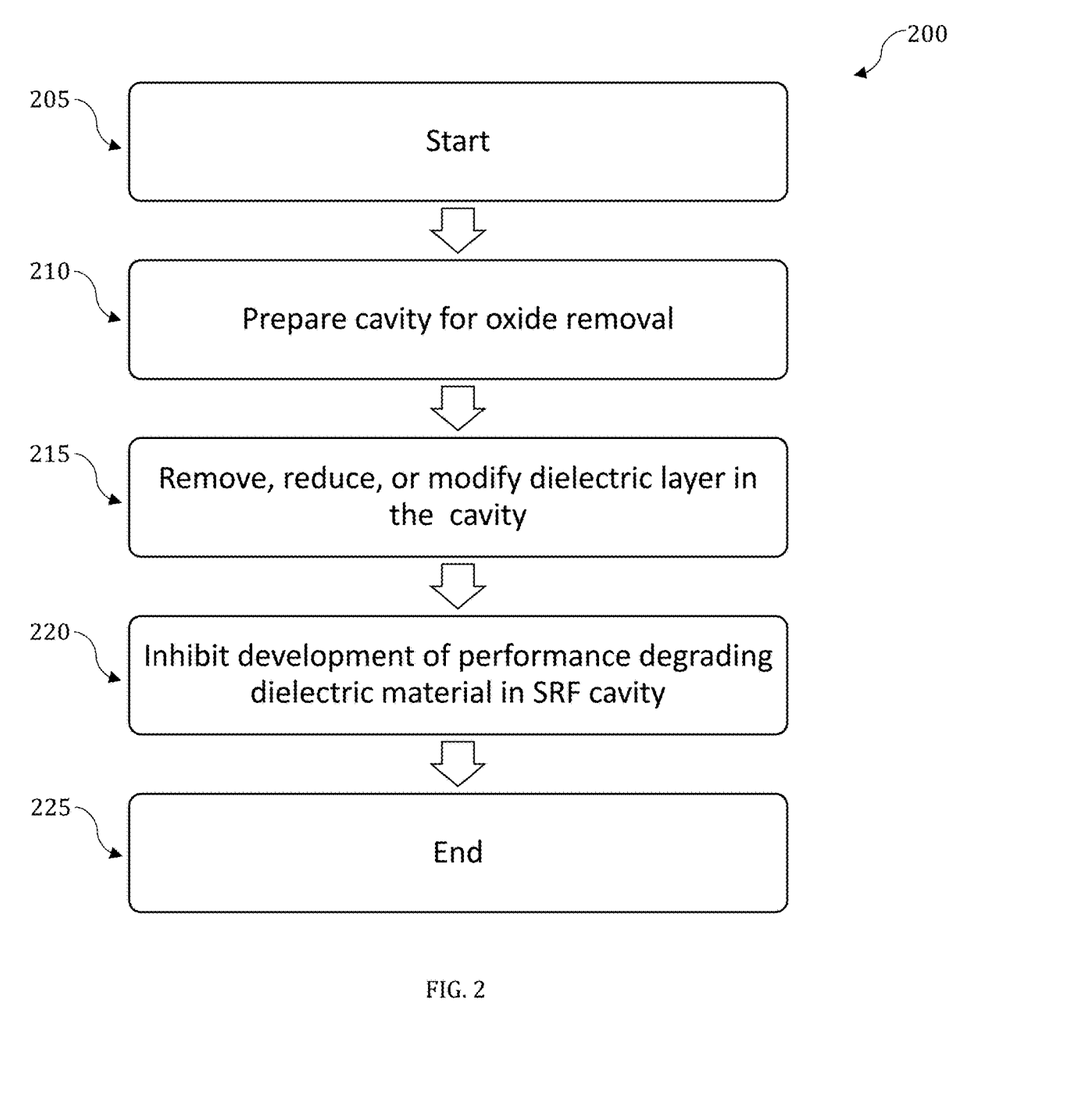
FIG. 2 depicts another embodiment of a method for treating an SRF cavity, in accordance with the disclosed embodiments.

FIG. 2 illustrates a more detailed embodiment of a method 200 for treating an SRF cavity in accordance with the disclosed embodiments. The method 200 starts at step 205.

At step 210, various preparational steps can be implemented to prepare the cavity for removal, reduction, or modification of any oxide layer formed on the internal surfaces of the cavity.

Figure 3A:
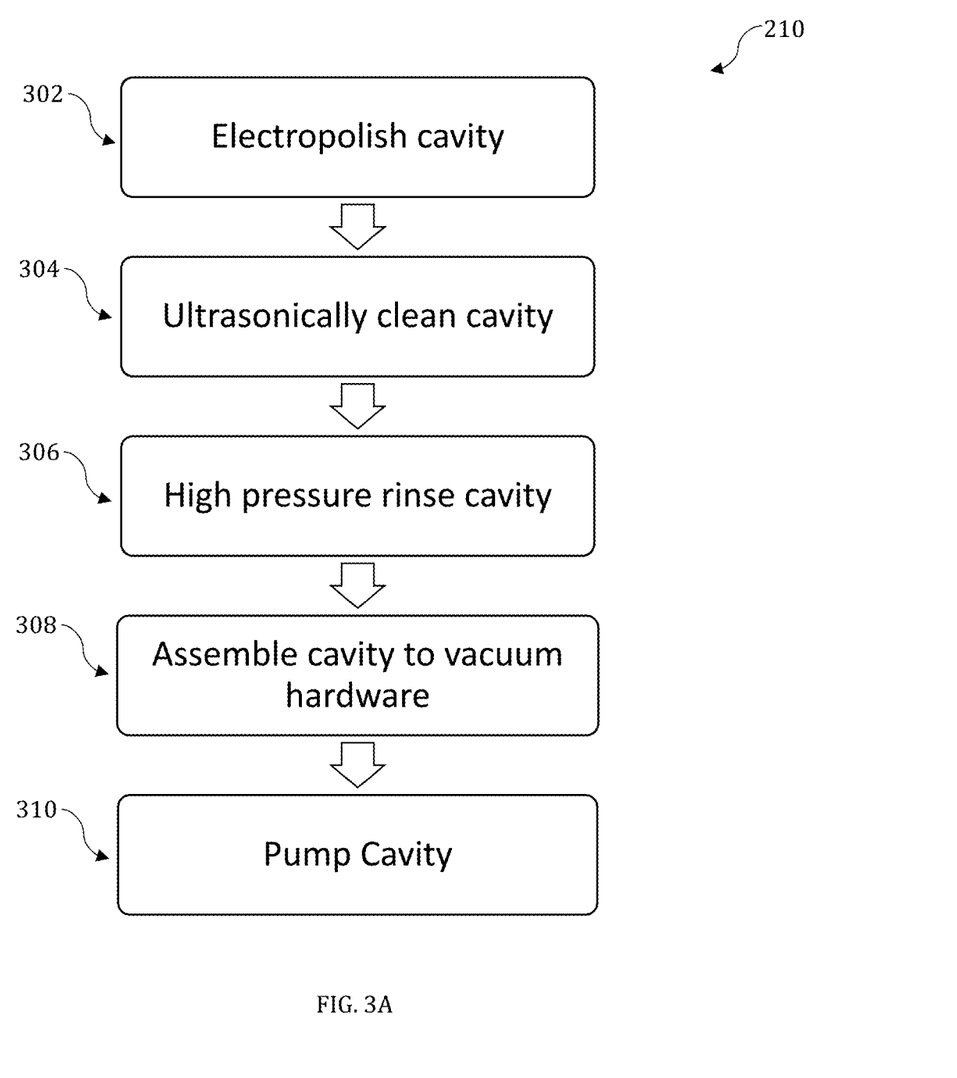
FIG. 3A depicts steps associated with the preparation of a cavity for heat treatment, in accordance with the disclosed embodiments.

FIG. 3A illustrates exemplary steps associated with method step 210 of method 200, for preparing a cavity for removal of harmful oxide layers on internal surfaces. At step 302, a cavity (e.g. a 1.3 GHz single cell cavity made from bulk niobium) can be electropolished. The cavity can alternatively or additionally be ultrasonically cleaned at step 304. The cavity can be rinsed with a high pressure water rinse, as shown at step 306. Other steps including baking or nitrogen doping the cavity may also be completed in alternative embodiments. It should be understood that the order of these steps is exemplary and the order can be rearranged in other embodiments as necessary for the specific application.

In certain embodiments, preparation step 210 can also include the aforementioned cleaning steps, and then assembling the cavity in a cleanroom environment. The cleanroom environment ensures the inner cavity surface is not exposed to potential contaminants that may result in the development of unwanted dielectric layers on the inner cavity surfaces.

The cavity can then be assembled to a vacuum system, at step 308 and pumped at step 310. The vacuum system can include vacuum connections with RF feedthroughs, a burst disc, and a pump-out port that can be fluidically connected to the cavity via the vacuum connections, and can be closed by a right angle valve. This can include connecting one or more ends of the cavity to vacuum hardware in the cleanroom environment.

The vacuum connections can be checked for leaks using a residual gas analyzer. Helium can be sprayed on the vacuum connections and the gas analyzer can be used to ensure good seals at the connections. If no leaks are detected, the assembled cavity is ready for further treatment as disclosed herein.

In other embodiments, at step 210, rather than using a vacuum, the inner surfaces of the cavity can be subjected to an inert gas atmosphere such as argon, or other such gas, to prevent exposure of the surface to atmospheric gases that could generate a dielectric layer in the cavity.

A primary contributing factor to the improvement in Q value of the cavity resulting from the methods disclosed herein, is the modification, reduction, or removal of the any layer with dielectric properties (usually the oxide layer) in the cavity. Thus, once the cavity has been prepared for dielectric removal at step 210, at step 215, the dielectric layer in the cavity can be reduced, removed, or modified in various ways.

Figure 3B:
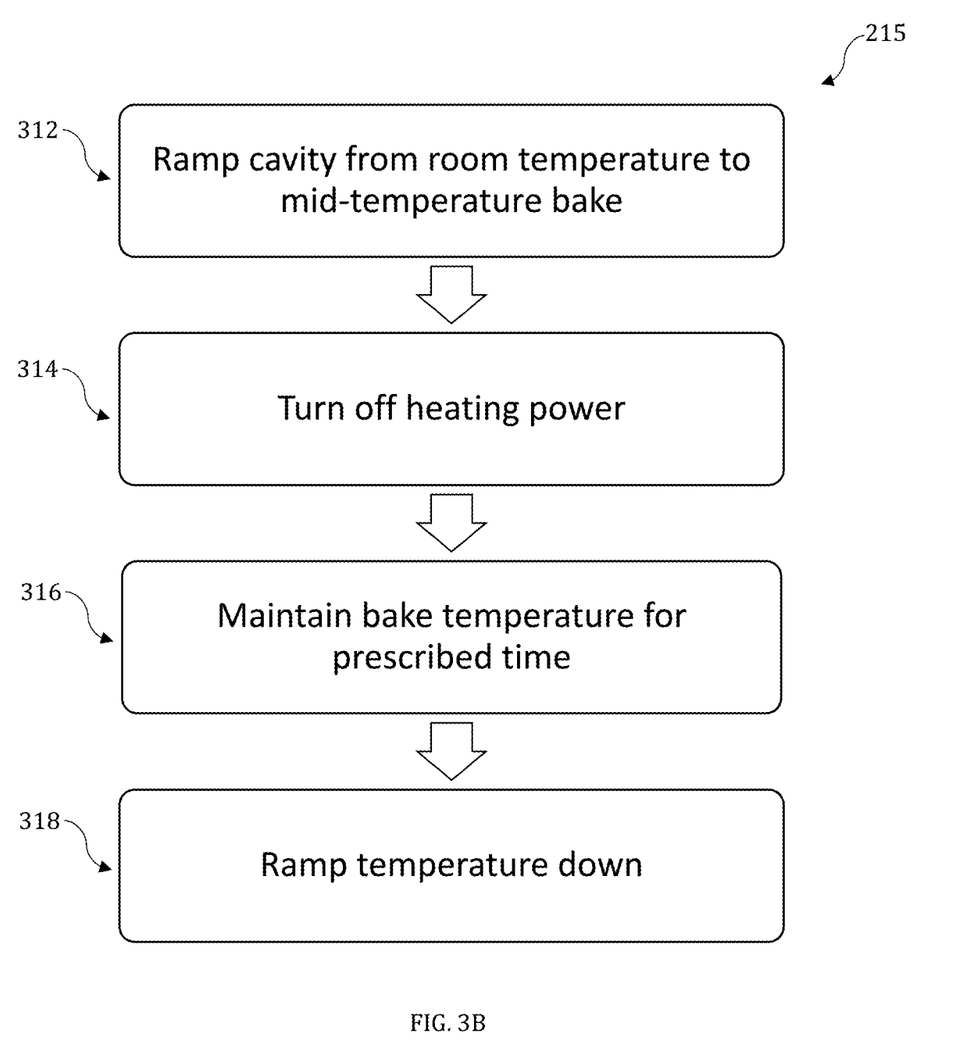
FIG. 3B depicts a heat treatment method for removing a dielectric layer in a cavity, in accordance with the disclosed embodiments.

In one embodiment, illustrated in FIG. 3B, the method for dissolution or dispersion of the dielectric layer comprises heat treatment, as illustrated at step 215. In this embodiment, at step 312, the cavity temperature can be ramped from room temperature to a maximum temperature between 250-400 degrees C., at a predetermined rate. In certain embodiments, the ramping rate can be approximately 2 degrees C./min to the maximum temperature. In certain embodiments, the maximum temperature can be held for approximately 2.5 hours. Once the temperature hold is complete, the heating power of the oven can be turned off at step 314.

Thermocouples placed on, or around, the cavity can be used to monitor the temperature of the cavity during the heat treatment at step 215. The temperature range over the surface of the cavity may vary between 250-400 degrees C. during this process. In certain embodiments this temperature range is between that used in a 120 degree C. low temperature bake (used to prevent High Field Q-Slope) and a >600 degree C. high temperature furnace treatment (used to degas hydrogen). As such, this temperature range (250-400 C) can be referred to as a "medium temperature bake."

During the medium temperature bake, the internal volume of the cavity can be pumped with a turbomolecular pump to remove any atmospheric gases from the inner volume of the cavity, or it can be maintained under an inert gas atmosphere, such as argon. In certain embodiments, after the medium temperature bake, the oven can be maintained at the baking temperature, as shown at 316. In an exemplary embodiment, the temperature can be maintained for approximately 2.5 hours although in other embodiments, the temperature can be maintained for up to 22 hours. As shown at step 318, the temperature of the cavity can then be ramped back down to room temperature. Cooling can take place over a selected time period.

It should be noted that throughout his process, the internal volume of the cavity can be pumped to ensure that atmospheric gases are not reintroduced. Such reintroduction may result in the formation of a new dielectric layer. In some embodiments, the outside of the cavity may be kept under an inert gas atmosphere to minimize the absorption of oxygen, hydrogen, and other atmospheric gases via the outer surface.

Before cooldown, in certain embodiments, an argon purge can be stopped and the oven temperature can be lowered to 120 degrees C. The cavity can then be backfilled with up to 25 mtorr of nitrogen via a needle valve (with the turbopump off) and maintained at stasis for up to 48 hours. This step may be added if nitrogen or other impurities are desired to be implanted in the surface layer. mpurities may also be added.

Figure 3C:
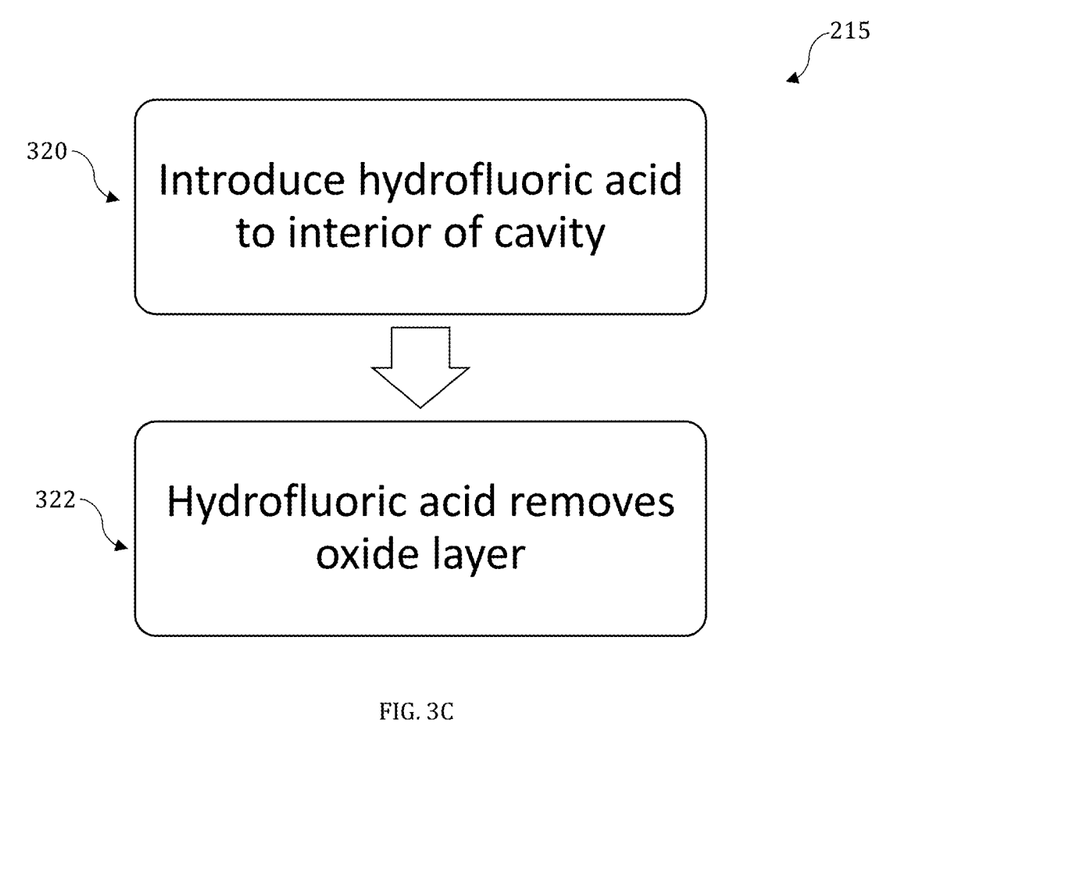
FIG. 3C depicts a method for chemically removing a dielectric layer in a cavity, in accordance with the disclosed embodiments.

In another embodiment of step 215 removal and/or reduction of the dielectric layer via chemical reaction can be completed as shown in FIG. 3C. Such chemical reactions can include the introduction of hydrofluoric acid on the niobium at step 320 which can remove the oxide as shown at step 322.

Figure 3D:
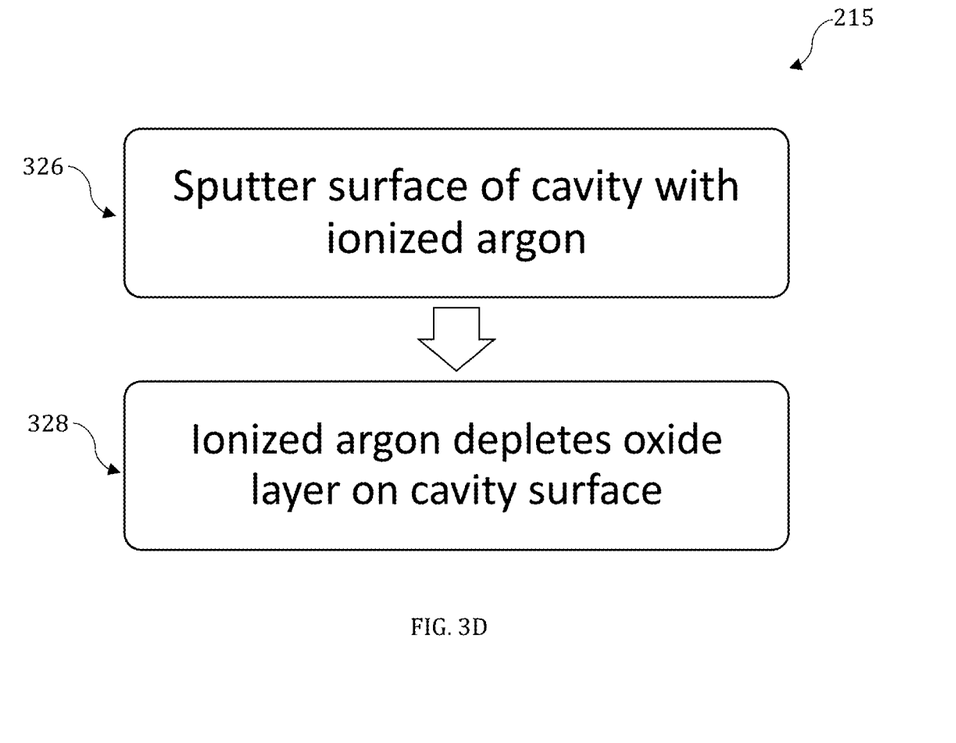
FIG. 3D depicts a method for removing a dielectric layer in a cavity via particle bombardment, in accordance with the disclosed embodiments.

In still other embodiments, step 215 can comprise removal and/or reduction of the dielectric layer via bombardment with charged particles as illustrated in FIG. 3D. In an exemplary embodiment, at step 326 the bombardment can be accomplished using sputtering with ionized argon. The ionized argon depletes or removes the dielectric on the cavity surface as shown at 328. In other embodiments, other particle bombardment methods can also be used.

It should be appreciated that in certain embodiments, one of more of the methods disclosed above and illustrated in FIGS. 3B-3D can be used in combination to remove a dielectric layer from the desired surfaces of the cavity, or other such device.

Once the necessary steps have been performed to remove or reduce the dielectric layer, as illustrated at step 215, it may be necessary to prevent the formation of any new dielectric layers, as illustrated at step 220. New dielectric growth is most commonly a result of the introduction of atmospheric gases in the cavity (for example, atmospheric oxygen can react with niobium to form $Nb_2O_5$).

Thus, step 220 can comprise limiting the exposure of the internal surfaces of the cavity to gases that can react with the surface to form a dielectric layer. This can be achieved, for example, by keeping the inner volume of the cavity under vacuum, or in an inert gas atmosphere, or by only allowing brief exposures of the inner cavity surface to atmosphere, mostly keeping the inner surface exposed only to vacuum or inert atmospheres after treatment.

For example, in an exemplary embodiment where the cavity is going to be put into use in a quantum computing application, this can be done while the cavity is kept under vacuum. If perturbation is required during setup, it is preferable to only briefly expose the inner surfaces of the cavity to air, or to prevent exposure to air entirely, by using a glovebox or other such device.

In certain embodiments, step 220 can be achieved by adding a "capping layer" to the internal surfaces of the cavity to prevent them from coming into direct contact with atmospheric gases. For example, in an embodiment, preventing growth of an oxide layer (e.g. pentoxide) can be accomplished with the capping layer applied to the internal surfaces of the cavity. The capping layer can be formed by encouraging the growth of a different, non-detrimental oxide, which can serve as a barrier to pentoxide.

Exemplary capping layers include, but are not limited to, Aluminum Oxide and Niobium Nitride. The capping layer can be described as a "passivating layer." The passivating layer offers the benefit that it can be encouraged in the existing device, as described herein, in-situ.

Figure 4:
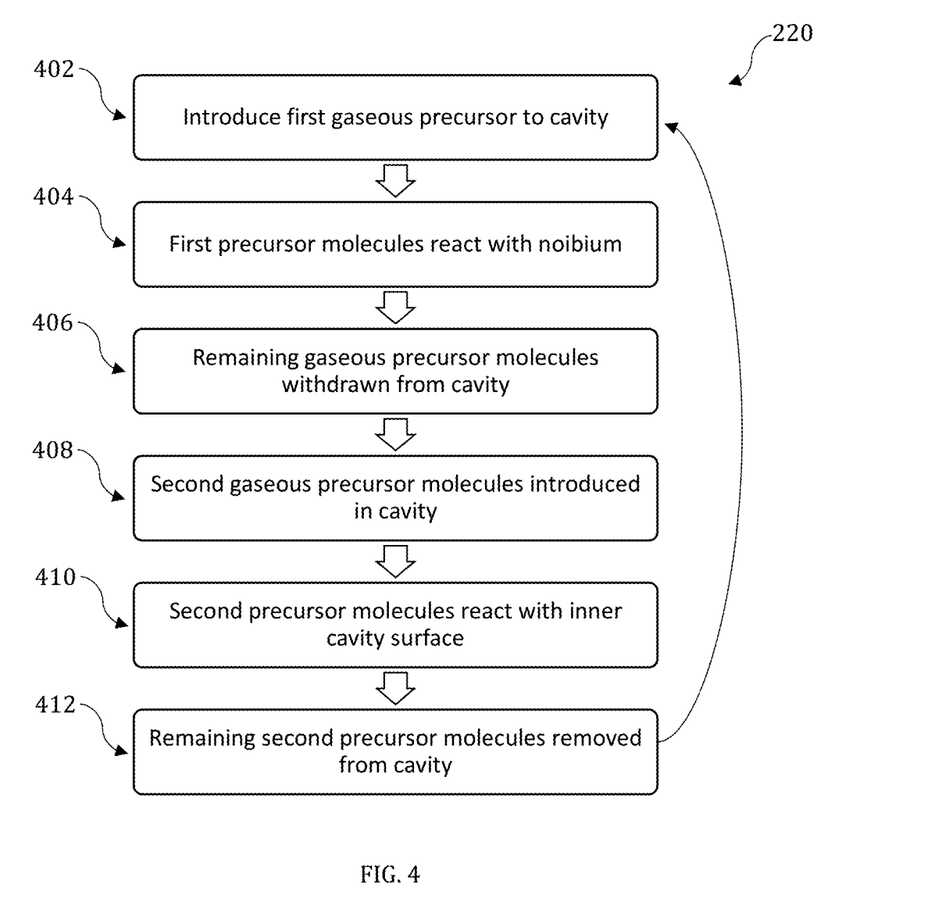
FIG. 4 depicts a method for preventing the formation of a new dielectric layer by forming a capping layer in a cavity, in accordance with the disclosed embodiments.

For example, in an embodiment the capping layer can be formed at step 220, using atomic layer deposition as illustrated in FIG. 4. In this case, a precursor comprising a first gaseous species can be introduced in the inner volume of the cavity as illustrated at 402. At step 404 the first gaseous precursor molecules interact with the niobium of the cavity. Next at step 406 any remaining gaseous vapor from the first precursor is drawn out of the cavity. A second gaseous precursor can then be introduced into the interior volume as shown at step 408. The second precursor interacts with the interior surfaces of the chamber at step 410. The second precursor can then be drawn out of the cavity as shown at step 412 and the process can be iterated until the desired capping layer has been deposited on the interior of the cavity.

It should be understood that, in certain cases, the capping layer can itself be dielectric. Thus, the embodiments disclosed herein should be understood to include the prevention of a new dielectric, or the prevention of a harmful dielectric to the extent that a harmful dielectric includes any dielectric that results in Q degradation.

Figure 5:
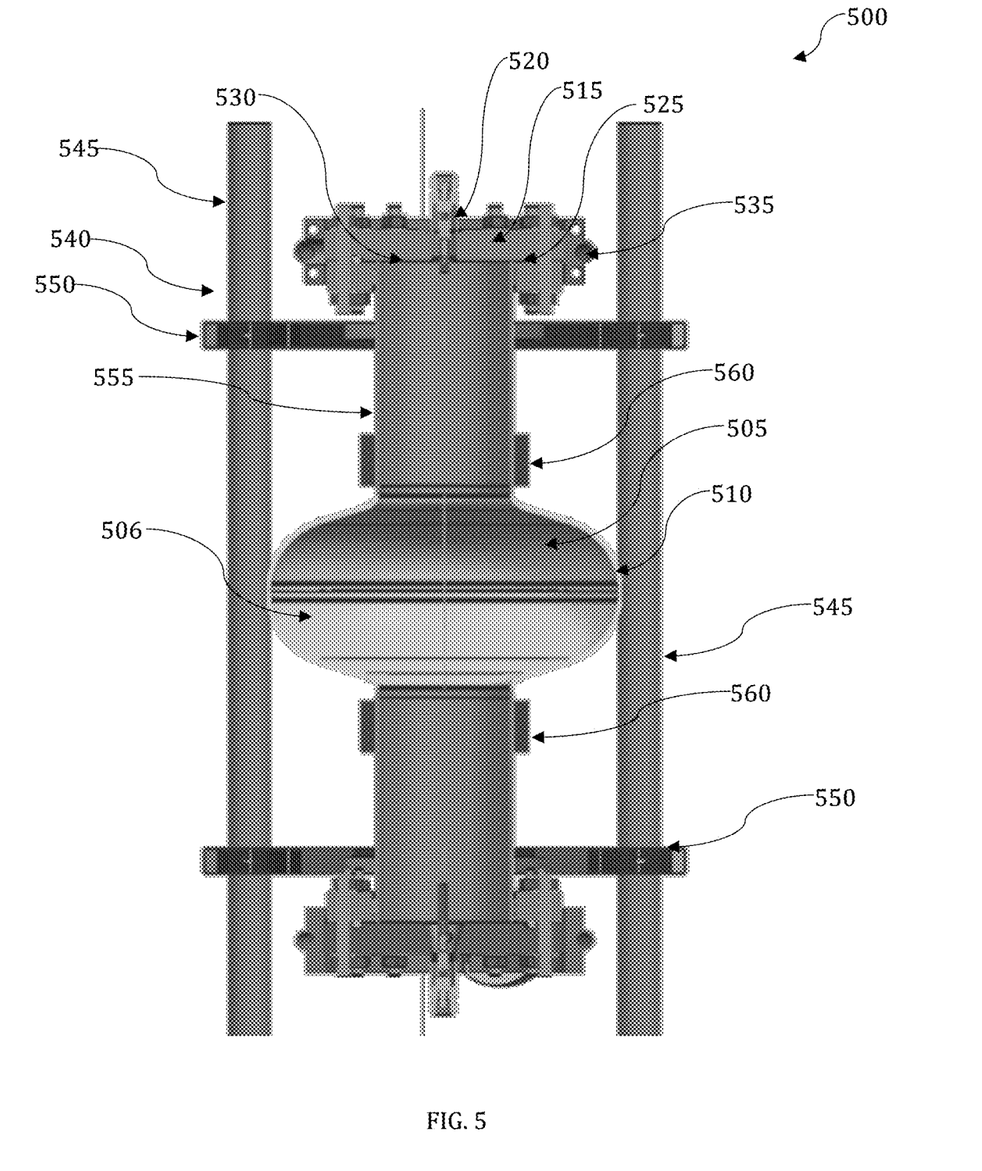
FIG. 5 depicts a diagram of a system for treating a cavity, in accordance with the disclosed embodiments.

FIG. 5 illustrates a system 500 for treating a cavity in accordance with the disclosed embodiments. As illustrated, the system 500 includes a cavity 505. In certain embodiments, the cavity 505 can comprise an SRF cavity, or other such resonator. It should be appreciated that the cavity 505 is exemplary and in other embodiments, the cavity 505 can represent other superconducting devices where an unwanted dielectric has formed and needs to be removed. In certain embodiments, the cavity 505 can be comprised of niobium, or can have niobium coated walls 510.

The cavity 505 can be sealed with vacuum connections 515. The vacuum connections 515 can be used to ensure a vacuum can be drawn in the interior 506 of the cavity 505. The vacuum connections 515 can include an RF feedthrough 520 that allows an RF signal to be fed into the cavity 505. The vacuum connections 515 are preferably cleaned and installed on the cavity 505 in a cleanroom environment as a part of the cavity preparation step illustrated as step 210 of method 200.

The vacuum connection 515 can be installed on the ends of the cavity openings 530 with a gasket 525 between the cavity opening 530 and vacuum connection 515. The gasket 525 facilitates the vacuum seal. In certain embodiments, the gasket 525 can be selected to be compatible with cryogenic temperatures (i.e. temperatures required for super conduction).

To that end, the gasket 525 can be cooled with a liquid cooled collar 535. The liquid cooled collar 535 comprises a conduit through which cooled liquid can flow to ensure that the gasket 525 remains cool enough to withstand the heat treatments, to which the cavity 505 is subjected, to remove internal dielectric layers. In certain embodiments, the liquid cooled collar 535 can be cooled with water, which is pumped to and from the liquid cooled collar 535 with a pump. The circulating water can be cooled with a water cooling system, so that the liquid cooled collar 535 keeps the gasket 525 at or below a threshold failure temperature.

During the treatment methods disclosed herein, the cavity 505 can be connected to a support frame 540. The support frame 540 can be configured with vertical members 545 and crossbeams 550. The support frame 540 is configured to withstand the temperatures to which the cavity 505 is subjected during heat treatment.

The external surfaces 555 of the cavity 505 can be kept warm with heating elements 560. The heating elements 560 are necessary to compensate for ambient cooling that may occur from the liquid cooled collar 535, particularly as the system is subject to heat treatment.

Figure 6:
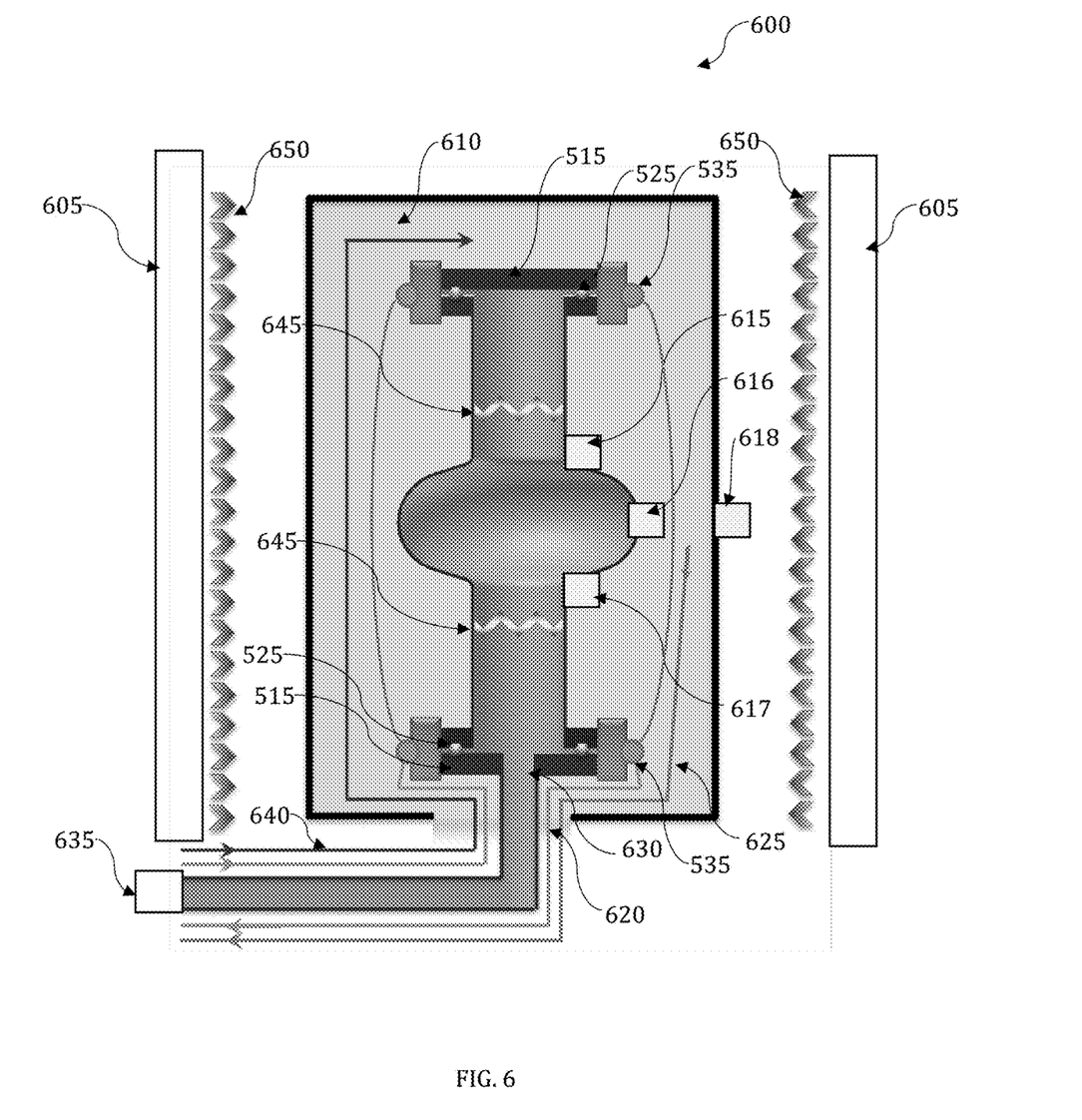
FIG. 6 depicts a schematic of a system for treating a cavity, in accordance with the disclosed embodiments.

FIG. 6 illustrates a schematic diagram 600 of the system 500, subject to heat treatment in accordance with the disclosed embodiments. It should be appreciated that the reference numerals provided in FIG. 6 may correlate to equivalent structures illustrated in FIG. 5.

The schematic diagram 600 illustrates the cavity 505 subject to a heat treatment or oven heating from oven heaters 605. The cavity 505 is subject to heat 650 provided from the oven heater 605. It should be appreciated that the oven heater 605 can comprise an oven chamber or other such apparatus, and is illustrated in profile in the schematic 600.

The oven 605 can include an enclosure 610. In certain embodiments the enclosure 610 can comprise the interior of the oven 605 or a separate enclosure, such as a steel can. $O_2$ 625 in the enclosure 610 can be purged from the enclosure 610 via the pumping of argon 640 (or other such gas) into the enclosure 610.

Heaters 560 can be configured as heat bands 645, that encircle the cavity 505. A plurality of thermocouples 615-618 can be connected to the cavity 505 and enclosure 610 to monitor temperature. For example, a thermocouple 615 can be connected to one side of the cavity 505 near the heat band 645, thermocouple 616 can be connected to a second portion of the cavity 505, and another thermocouple 617 can be connected to another portion of the cavity 505 closer to the second heat band 645. A thermocouple 618 can also be connected to the enclosure 610.

Liquid cooling can be circulated to the liquid cooling collar 535 via lines 620. In certain embodiments, the liquid can comprise water circulated with a water pump. The liquid cooling collar 535 can be provided on both ends of the cavity 505 to cool the gasket 525 between the cavity opening and the vacuum connections 515.

Vacuum line 630 can be connected to the cavity 505 through the vacuum connection 515. The vacuum line 630 can be used to draw a vacuum inside the cavity 505, with a vacuum pulling system 635 connected to the vacuum line 630.

The embodiments disclosed herein describe various systems and methods for removing and/or minimizing oxidation in the interior of a cavity, such as a superconducting radio frequency cavity, for the purpose of reducing or eliminating Q degradation in a low-temperature, low-field regime. In some, but not all embodiments, this can include thermal treatment of the SRF cavity under vacuum.

According to the embodiments disclosed herein, state-of-the-art SRF accelerator cavities can be produced that can be directly taken to the quantum regime, exhibiting the longest demonstrated coherence times to date (e.g. 2 seconds). This opens a pathway of exploring, for example, coupled SRF cavity-transmon structures as the highest coherence superconducting quantum circuits for quantum computing and other potential applications. In particular, implementing certain protocols allows direct generation of very long-lived Fock states in SRF cavities.

In summary, the disclose embodiments include methods and systems for creating state-of-the-art SRF accelerator cavities in the quantum regime. The embodiments further address quality factor decrease at lower temperatures, consistent with the contribution of TLS degradation, hosted by niobium oxide and provide mitigation of this phenomena, by in-situ heat treatment, resulting in the removal of the dielectric layer.

Based on the foregoing, it can be appreciated that a number of embodiments, preferred and alternative, are disclosed herein. For example, in an embodiment, a method comprises preparing a device for removal of a dielectric layer from on an inner surface of the device, removing the dielectric layer from the inner surface of the device, and preventing the development of a new dielectric layer on the inner surface of the device by preventing an interaction between the inner surface of the device and atmospheric gasses.

In an embodiment, removing the dielectric layer further comprises exposing the device to a heat treatment. In an embodiment, exposing the device to a heat treatment further comprises evacuating an internal volume of the device, ramping the device to a mid-temperature bake, baking the device for a prescribed time, and ramping the temperature of the device down.

In an embodiment, removing the dielectric layer further comprises creating a chemical reaction with the dielectric layer on the inner surface of the device. In an embodiment, removing the dielectric layer further comprises bombarding the dielectric layer with charged particles.

In an embodiment, preventing the development of a new dielectric layer on the inner surface of the device by preventing an interaction between the inner surface of the device and atmospheric gasses further comprises preventing the introduction of atmospheric gasses into the interior volume of the device. In an embodiment, preventing the development of a new dielectric layer on the inner surface of the device by preventing an interaction between the inner surface of the device and atmospheric gasses further comprises adding a capping layer to the inner surface of the device.

In an embodiment, the method comprises repeating the step of removing the dielectric layer from the inner surface of the device.

In an embodiment, the device comprises a superconducting radio frequency cavity. In an embodiment, the superconducting radio frequency cavity is comprised of niobium.

In an embodiment, a method for treating a cavity comprises preparing a superconducting radio frequency (SRF) cavity for removal of a dielectric layer from on an inner surface of the SRF cavity, subjecting the SRF cavity to a heat treatment in order to remove the dielectric layer from the inner surface of the SRF cavity, and preventing the development of a new dielectric layer on the inner surface of the SRF cavity by preventing an interaction between the inner surface of the SRF cavity and atmospheric gasses.

In an embodiment, the superconducting radio frequency cavity is comprised of niobium.

In an embodiment, subjecting the SRF cavity to a heat treatment further comprises evacuating an internal volume of the SRF cavity, ramping the cavity to a mid-temperature bake, baking the SRF cavity for a prescribed time, and ramping the temperature of the SRF cavity down.

In an embodiment, the method comprises preparing the superconducting radio frequency (SRF) cavity for removal of the dielectric layer from on the inner surface of the SRF cavity further comprises electropolishing the SRF cavity, ultrasonically cleaning the SRF cavity, rinsing the SRF cavity with a high pressure rinse, and assembling the SRF cavity to vacuum hardware.

In an embodiment, a system for treating a cavity comprises a superconducting radio frequency (SRF) cavity with an inner volume defined by an inner surface, a vacuum pulling system coupled to the SRF cavity and configured to draw a vacuum in the inner volume of the SRF cavity, and an oven configured to expose the SRF cavity to a heat treatment wherein the heat treatment removes a dielectric layer from the inner surface of the SRF cavity. In an embodiment, the SRF cavity comprises niobium.

In an embodiment, the system further comprises a vacuum connection configured to connect the SRF cavity to the vacuum pulling system. In an embodiment, the system further comprises a gasket formed between the SRF cavity and the vacuum connection. In an embodiment, the system further comprises a liquid cooled collar configured to cool the gasket formed between the SRF cavity and the vacuum connection. In an embodiment, the system further comprises at least one thermocouple configured to measure a temperature of the SRF cavity during the heat treatment.

It will be appreciated that variations of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art which are also intended to be encompassed by the following claims.

What is claimed is:

1. A method comprising:
   preparing a device for removal of a dielectric layer from on an inner surface of the device;
   removing the dielectric layer from the inner surface of the device; and
   reducing two-level-system (TLS) degradation of the device, wherein reducing TLS degradation of the device further comprises:
   preventing development of a new dielectric layer on the inner surface of the device by preventing an interaction between the inner surface of the device and atmospheric gasses by adding a capping layer to the inner surface of the device, the capping layer comprising Aluminum Oxide.

2. The method of claim 1 wherein removing the dielectric layer further comprises:
   exposing the device to a heat treatment.

3. The method of claim 2 wherein exposing the device to a heat treatment further comprises:
   evacuating an internal volume of the device during the heat treatment;
   ramping the device to a medium temperature bake of 300-400 degrees Celsius;
   baking the device for a prescribed time; and
   ramping the temperature of the device down.

4. The method of claim 1 wherein removing the dielectric layer further comprises:
   creating a chemical reaction with the dielectric layer on the inner surface of the device by introducing acid on the inner surface of the device.

5. The method of claim 1 wherein removing the dielectric layer further comprises:
   sputtering the dielectric layer.

6. The method of claim 1 wherein preventing the development of a new dielectric layer on the inner surface of the device by preventing an interaction between the inner surface of the device and atmospheric gasses further comprises:
   preventing the introduction of atmospheric gasses into the interior volume of the device.

7. The method of claim 1 wherein the capping layer exhibits minimal TLS degradation.

8. The method of claim 1 wherein the device comprises a superconducting radio frequency cavity for quantum computing or quantum sensing.

9. The method of claim 8 wherein the superconducting radio frequency cavity is comprised of niobium.

10. A method for treating a cavity comprising:
    preparing a superconducting radio frequency (SRF) cavity for quantum computing applications, for removal of a dielectric layer from on an inner surface of the SRF cavity;
    subjecting the SRF cavity to a heat treatment in order to remove the dielectric layer from the inner surface of the SRF cavity; and
    reducing TLS degradation of the SRF cavity, wherein reducing TLS degradation of the SRF cavity further comprises:
    preventing the development of a new dielectric layer on the inner surface of the SRF cavity by preventing an interaction between the inner surface of the SRF cavity and atmospheric gasses; and
    wherein the prepared SRF cavity has a quality factor greater than $1 \times 10^{10}$ at temperatures between 1.4 Kelvin and 20 mKelvin.

11. The method for treating a cavity of claim 10 wherein the superconducting radio frequency cavity is comprised of niobium.

12. The method of claim 11 wherein subjecting the SRF cavity to a heat treatment further comprises:
    evacuating an internal volume of the SRF cavity;
    ramping the cavity to a medium temperature bake of 300-400 degrees Celsius at a nominal rate of 2 degrees Celsius per minute, in order to dissolve oxides on the inner surface of the SRF cavity;

baking the SRF cavity for a prescribed time; and ramping the temperature of the SRF cavity down.

13. The method of claim 11 wherein preparing the superconducting radio frequency (SRF) cavity for removal of the dielectric layer from on the inner surface of the SRF cavity further comprises:

electropolishing the SRF cavity;

ultrasonically cleaning the SRF cavity;

rinsing the SRF cavity with a high pressure rinse; and assembling the SRF cavity to vacuum hardware; and nitrogen doping the SRF cavity.

\* \* \* \* \*